United States Patent
Yoshino et al.

(10) Patent No.: US 12,415,821 B2
(45) Date of Patent: Sep. 16, 2025

(54) TIN COMPOUND, THIN-FILM FORMING RAW MATERIAL CONTAINING SAID COMPOUND, THIN FILM FORMED FROM SAID THIN-FILM FORMING RAW MATERIAL, METHOD OF PRODUCING SAID THIN FILM USING SAID COMPOUND AS PRECURSOR, AND METHOD OF PRODUCING SAID THIN FILM

(71) Applicant: ADEKA CORPORATION, Tokyo (JP)

(72) Inventors: Tomoharu Yoshino, Tokyo (JP); Yoshiki Ooe, Tokyo (JP); Atsushi Yamashita, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 358 days.

(21) Appl. No.: 17/769,458

(22) PCT Filed: Oct. 12, 2020

(86) PCT No.: PCT/JP2020/038451
§ 371 (c)(1),
(2) Date: Apr. 15, 2022

(87) PCT Pub. No.: WO2021/075397
PCT Pub. Date: Apr. 22, 2021

(65) Prior Publication Data
US 2023/0002423 A1 Jan. 5, 2023

(30) Foreign Application Priority Data
Oct. 17, 2019 (JP) .................................. 2019-189930

(51) Int. Cl.
*C07F 7/22* (2006.01)
*C23C 16/18* (2006.01)

(52) U.S. Cl.
CPC ............ *C07F 7/2284* (2013.01); *C23C 16/18* (2013.01)

(58) Field of Classification Search
CPC .. C07F 7/2284; C23C 16/18; C23C 16/45553
See application file for complete search history.

(56) References Cited

U.S. PATENT DOCUMENTS

| | | | | |
|---|---|---|---|---|
| 5,395,887 A | * | 3/1995 | Gondard | C08K 5/57 525/131 |
| 2014/0119977 A1 | | 5/2014 | Gatineau et al. | |
| 2018/0155372 A1 | * | 6/2018 | Ryu | C23C 16/45553 |

FOREIGN PATENT DOCUMENTS

| | | |
|---|---|---|
| JP | 6-502877 | 3/1994 |
| JP | 2015-129317 | 7/2015 |
| JP | 2018-35072 | 3/2018 |
| JP | 2018-35375 | 3/2018 |
| JP | 2018-203641 | 12/2018 |
| KR | 10-2017-0059742 | 5/2017 |

OTHER PUBLICATIONS

S. Sakai et al.,50 Journal of Organometallic Chemistry 113-119 (1973) (Year: 1973).*
J-H. Lee, et al. 10 ACS applied materials & interfaces 33335-33342 (2018) (Year: 2018).*
International Search Report issued Nov. 24, 2020 in International (PCT) Application No. PCT/JP2020/038451.
Ursula Buenzli-Trepp, "Systematic Nomenclature of Organic, Organometallic and Coordination Chemistry: Chemical-Abstracts Guidelines with IUPAC Recommendations and Many Trivial Names," 1st ed., EPFL Press, 2007, p. 79.
O.J. Sherer, J. Schmidt, J. Wokulat and M. Schmidt, "Cyclic dimethyl-tin-diamides through re-amination," Zeitschrift Fur Naturforschung, 1965, vol. 20b, No. 2, pp. 183-184, with English-language Translation.
Shizuyoshi Sakai et al., "Reactions of 2,2-dialkyl-1-oxa-3-aza-2-stannacyclopentanes and 2,2-dialkyl-1,3-diaza-2-stannacyclopentanes With Carbon Disulfide and Phenyl Isothiocyanate", Journal of Organometallic Chemistry, vol. 50 (1973), pp. 113-119.

* cited by examiner

*Primary Examiner* — Alexander R Pagano
*Assistant Examiner* — Frank S. Hou
(74) *Attorney, Agent, or Firm* — Wenderoth, Lind & Ponack, L.L.P.

(57) ABSTRACT

The present invention provides a tin compound represented by the following general formula (1) (in the formula (1), $R^1$ to $R^4$ each independently represent a hydrogen atom or an alkyl group having 1 to 12 carbon atoms, and $R^5$ represents an alkanediyl group having 1 to 15 carbon atoms), a thin-film forming raw material including the compound, a thin-film formed by using the thin-film forming raw material, a method of using the compound as a precursor for producing the thin-film, and a method of producing a thin-film including: introducing a raw material gas obtained by vaporizing the thin-film forming raw material into a treatment atmosphere having a substrate set therein; and subjecting the tin compound in the raw material gas to decomposition and/or a chemical reaction in the treatment atmosphere, to thereby produce a thin-film containing a tin atom on a surface of the substrate.

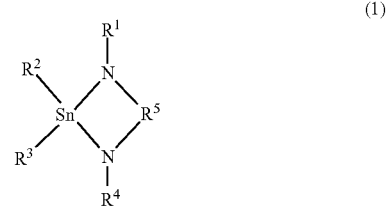

(1)

6 Claims, 4 Drawing Sheets

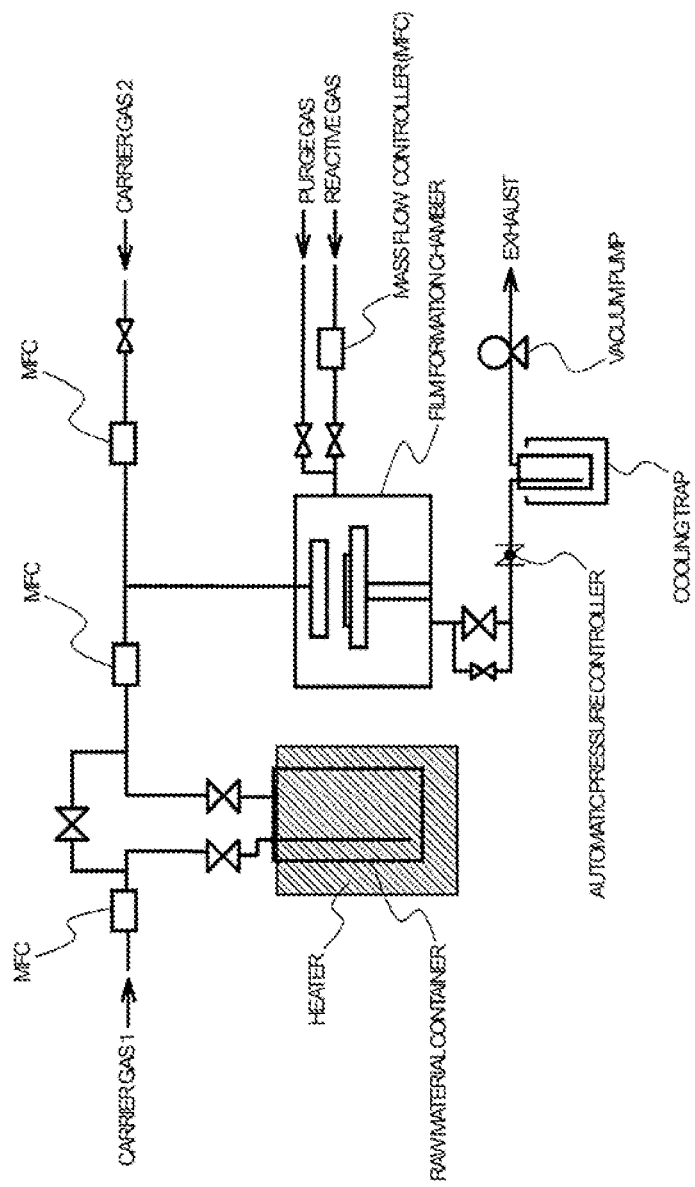
[Fig. 1]

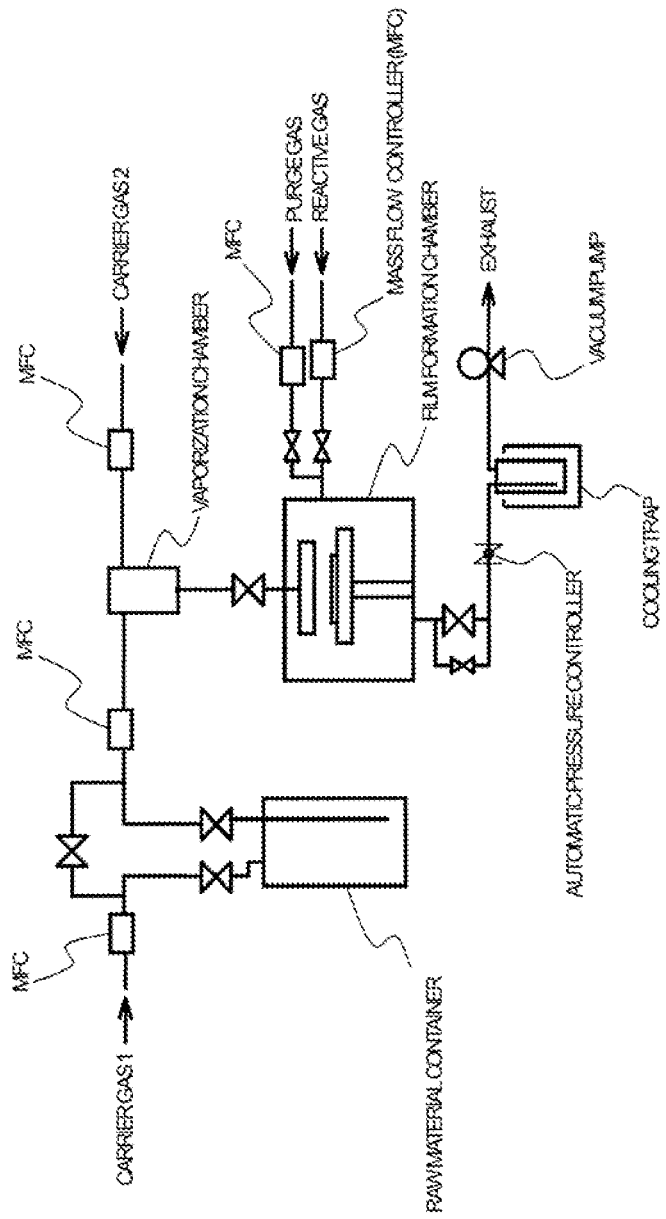
[Fig. 2]

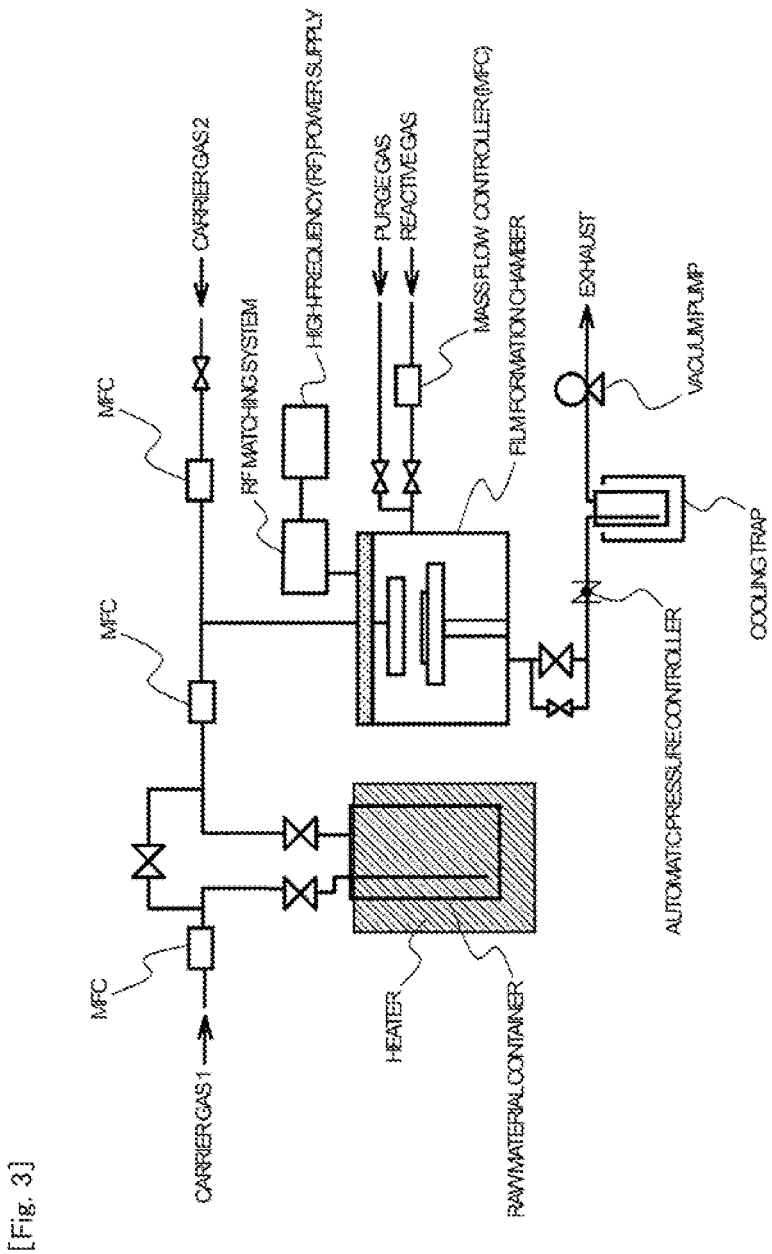
[Fig. 3]

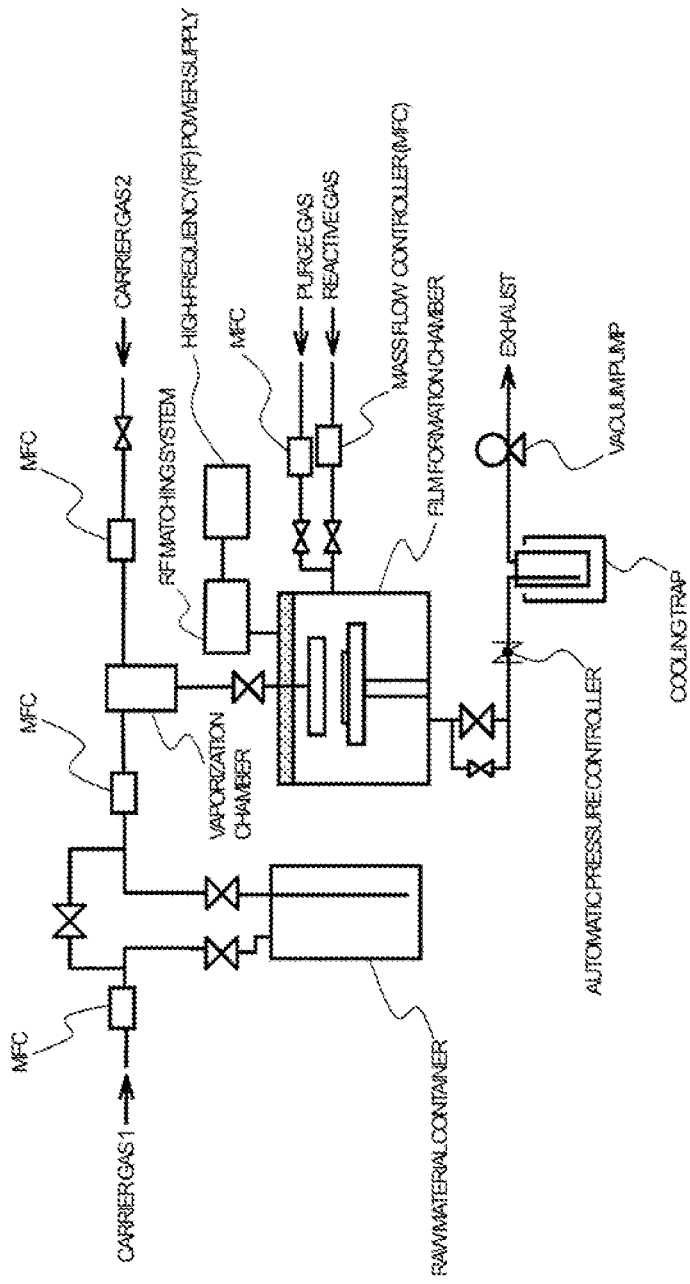
[Fig. 4]

TIN COMPOUND, THIN-FILM FORMING RAW MATERIAL CONTAINING SAID COMPOUND, THIN FILM FORMED FROM SAID THIN-FILM FORMING RAW MATERIAL, METHOD OF PRODUCING SAID THIN FILM USING SAID COMPOUND AS PRECURSOR, AND METHOD OF PRODUCING SAID THIN FILM

TECHNICAL FIELD

The present invention relates to a noble tin compound, a thin-film forming raw material containing the compound, a thin-film containing a tin atom formed by using the thin-film forming raw material, a method of using the compound as a precursor for producing the thin-film, and a method of producing the thin-film.

BACKGROUND ART

Tin is used as a component for forming a compound semiconductor, and various compounds have been reported as thin-film forming raw materials for producing thin-films each containing a tin atom.

As a method of producing a thin-film, there are given, for example, a sputtering method, an ion plating method, MOD methods, such as a coating pyrolysis method and a sol-gel method, and chemical vapor deposition methods (sometimes referred to as "CVD methods"). Of those, an atomic layer deposition method (sometimes referred to as "ALD method"), which is one kind of the CVD methods, is the optimum production process because the method has many advantages, such as excellent composition controllability and step coverage, suitability for mass production, and capability of hybrid integration.

The ALD method is a film formation technology involving using a vacuum, and is capable of forming a film by repeating a cycle of loading of a precursor and purging thereof to deposit atomic layers one by one. The film formation technology of the ALD method enables film formation of an extremely thin-film, film formation on a structure having a high aspect ratio, film formation free of a pin hole, film formation at low temperatures, and the like as compared to film formation technologies of the other chemical vapor deposition methods, and is hence utilized particularly in the nanotechnology and for production of an electronic material device, such as a capacitor electrode, a gate electrode, or an integrated circuit.

As the precursor for the ALD method, there are proposed, for example, a silicon compound in Patent Document 1, a compound containing a molybdenum atom, a vanadium atom, a cobalt atom, a nickel atom, a copper atom, or a chromium atom in Patent Document 2, a diazadienyl compound in Patent Document 3, and a compound containing a zirconium atom, a titanium atom, or a hafnium atom in Patent Document 4.

CITATION LIST

Patent Document

[Patent Document 1] JP 2015-129317 A
[Patent Document 2] JP 2018-035375 A
[Patent Document 3] JP 2018-035072 A
[Patent Document 4] JP 2018-203641 A

SUMMARY OF INVENTION

Technical Problem

The precursor to be used particularly for the ALD method as a thin-film forming raw material is required to have high thermal stability, show a high vapor pressure, and be capable of forming a high-quality thin-film.

Solution to Problem

The inventors of the present invention have made extensive investigations, and as a result, have found that the foregoing can be achieved by a tin compound having a noble structure. Thus, the inventors have reached the present invention.

According to one embodiment of the present invention, there is provided a tin compound represented by the general formula (1).

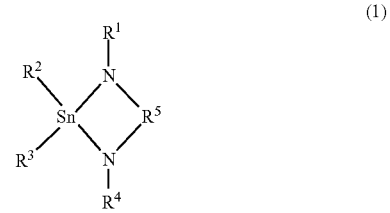

In the general formula (1), $R^1$ to $R^4$ each independently represent a hydrogen atom or an alkyl group having 1 to 12 carbon atoms, and $R^5$ represents an alkanediyl group having 1 to 15 carbon atoms.

According to one embodiment of the present invention, there is provided a thin-film forming raw material, containing the tin compound according to the one embodiment of the present invention.

According to one embodiment of the present invention, there is provided a method of using the tin compound according to the one embodiment of the present invention as a precursor for producing a thin-film containing a tin atom by a chemical vapor deposition method.

According to one embodiment of the present invention, there is provided a thin-film, which is a thin-film containing a tin atom produced by using the thin-film forming raw material according to the one embodiment of the present invention. In addition, according to one embodiment of the present invention, there is provided a thin-film, which is a thin-film containing a tin atom produced by the method of using the tin compound according to the one embodiment of the present invention as a precursor.

In addition, according to one embodiment of the present invention, there is provided a method of producing a thin-film, comprising: introducing a raw material gas obtained by vaporizing the thin-film forming raw material according to the one embodiment of the present invention into a film formation chamber (treatment atmosphere) having a substrate set therein; and subjecting the tin compound in the raw material gas to decomposition and/or a chemical reaction in the treatment atmosphere, to thereby produce a thin-film containing a tin atom on a surface of the substrate.

According to one embodiment of the present invention, there is provided a method of producing a thin-film containing a tin atom on a surface of a substrate by an ALD method, the method comprising: a first step of introducing a raw material gas obtained by vaporizing the thin-film forming raw material according to the one embodiment of the present invention into a film formation chamber (treatment atmosphere) having a substrate set therein, and depositing the tin compound in the raw material gas on a surface of the substrate, to thereby form a precursor layer; and a second step of introducing a reactive gas into the treatment atmosphere to cause the precursor layer and the reactive gas to react with each other.

Advantageous Effects of Invention

The tin compound of the present invention is excellent in thermal stability and has a high vapor pressure. As a result, the tin compound can be vaporized at lower temperatures, and is hence suitable as a thin-film forming raw material. When a thin-film is produced by using a thin-film forming raw material containing the tin compound of the present invention by an ALD method, the tin compound has a wide ALD window, and a high-quality thin-film containing a tin atom less residual carbon can be obtained.

BRIEF DESCRIPTION OF DRAWINGS

FIG. 1 is a schematic diagram for illustrating an example of an ALD apparatus to be used in a method of producing a thin-film according to the present invention.

FIG. 2 is a schematic diagram for illustrating another example of the ALD apparatus to be used in the method of producing a thin-film according to the present invention.

FIG. 3 is a schematic diagram for illustrating still another example of the ALD apparatus to be used in the method of producing a thin-film according to the present invention.

FIG. 4 is a schematic diagram for illustrating yet still another example of the ALD apparatus to be used in the method of producing a thin-film according to the present invention.

DESCRIPTION OF EMBODIMENTS

Tin Compound

First, a tin compound of the present invention is described. The tin compound of the present invention is represented by the following general formula (1).

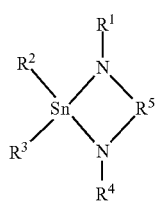

(1)

In the formula (1), $R^1$ to $R^4$ each independently represent a hydrogen atom or an alkyl group having 1 to 12 carbon atoms, and $R^1$ represents an alkanediyl group having 1 to 15 carbon atoms.

The alkyl group having 1 to 12 carbon atoms represented by each of $R^1$ to $R^4$ in the general formula (1) may be linear or branched. Specific examples thereof include a methyl group, an ethyl group, a propyl group, an isopropyl group, a butyl group, a sec-butyl group, a tert-butyl group, an isobutyl group, a pentyl group, an isopentyl group, and a tert-pentyl group. An alkyl group having more than 12 carbon atoms has a high melting point, and cannot be used as a thin-film forming raw material in some cases.

In the tin compound of the present invention, it is preferred that $R^1$ to $R^4$ each represent an alkyl group having 1 to 5 carbon atoms because a high vapor pressure is obtained. It is more preferred that $R^1$ to $R^4$ each represent a methyl group, an ethyl group, an isopropyl group, or a n-propyl group. It is even more preferred that $R^2$ and $R^3$ each represent a methyl group, and $R^1$ and $R^4$ each represent a methyl group, an ethyl group, or an isopropyl group. It is yet even more preferred that $R^2$ and $R^3$ each represent a methyl group, and $R^1$ and $R^4$ each represent an ethyl group or an isopropyl group. It is most preferred that $R^2$ and $R^1$ each represent a methyl group, and $R^1$ and $R^4$ each represent an isopropyl group.

The alkanediyl group having 1 to 15 carbon atoms represented by $R^5$ in the general formula (1) may be linear or branched. In the tin compound of the present invention, it is preferred that $R^5$ be selected from the group consisting of units represented by the following formulae (x-1) to (x-24). It is more preferred that $R^5$ represents a unit represented by the formula (x-6).

"*" represents a linking position to a nitrogen atom in the general formula (1). In addition, "Me" represents a methyl group, "Et" represents an ethyl group, "iPr" represents an isopropyl group, and "nPr" represents a linear propyl group.

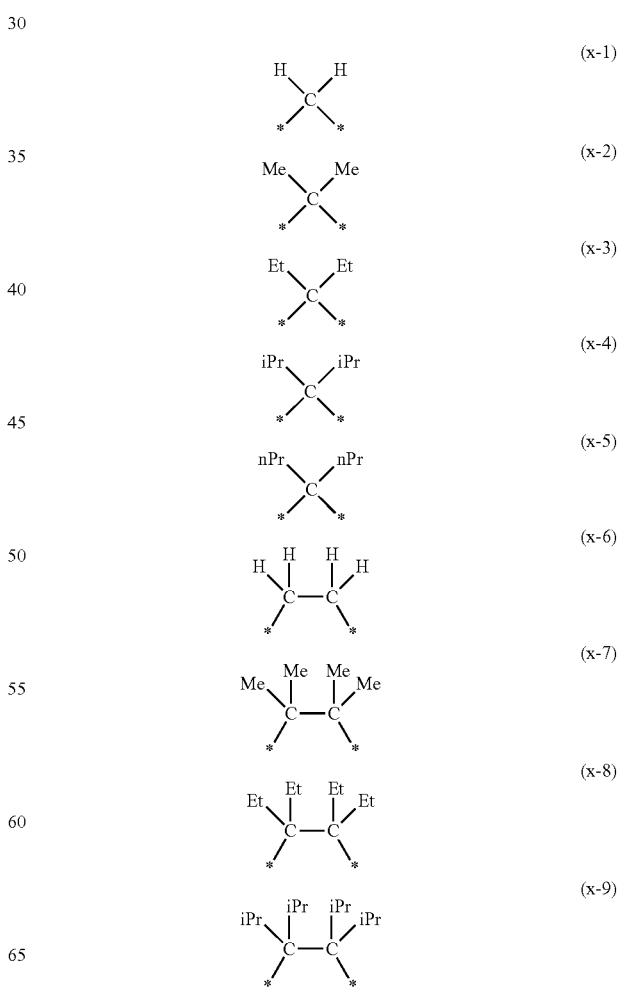

(x-10) 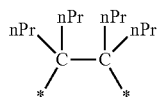

(x-11) 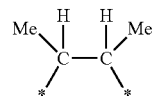

(x-12) 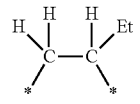

(x-13) 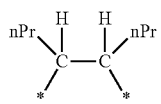

(x-14) 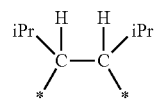

(x-15) 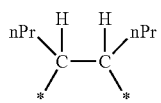

(x-16) 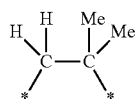

(x-17) 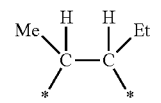

(x-18) 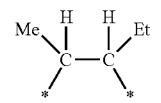

(x-19) 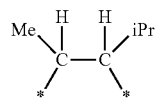

(x-20) 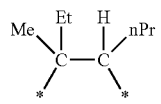

(x-21) 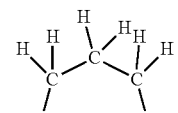

(x-22) 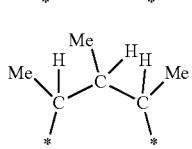

(x-23) 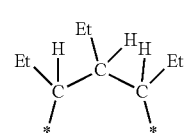

(x-24) 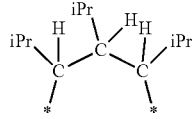

The tin compound of the present invention is not particularly limited by a production method therefor, and may be produced by a well-known synthesis method. For example, the tin compound of the present invention may be produced by causing a dialkyltin chloride, such as dimethyltin dichloride, diethyltin chloride, or di-n-butyl chloride, to react with a dialkylalkylenediamine through use of a catalyst.

As a specific structure of the tin compound of the present invention, there are given the following chemical formulae (Compound No. 1 to Compound No. 60), but the present invention is not limited to these compounds. In the following Compound No. 1 to Compound No. 60, "Me" represents a methyl group, "Et" represents an ethyl group, "iPr" represents an isopropyl group, and "nPr" represents a linear propyl group.

Compound No. 1

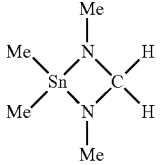

Compound No. 2

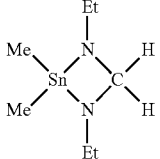

Compound No. 3

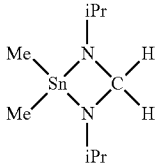

Compound No. 4

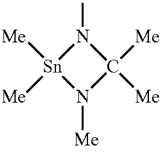

Compound No. 5

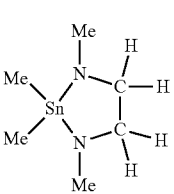

-continued
Compound No. 6
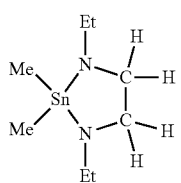
Compound No. 7
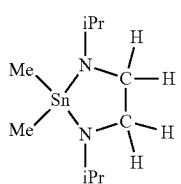
Compound No. 8
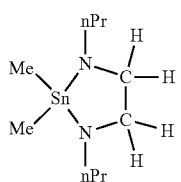
Compound No. 9
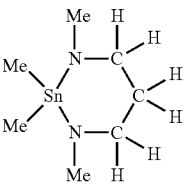
Compound No. 10
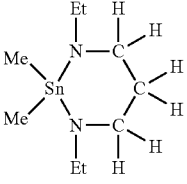
Compound No. 11
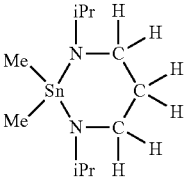
Compound No. 12
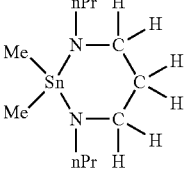
Compound No. 13
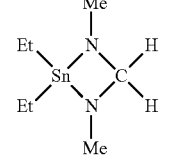
-continued
Compound No. 14
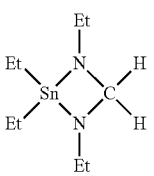
Compound No. 15
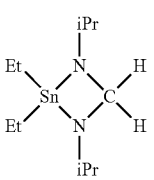
Compound No. 16
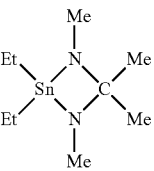
Compound No. 17
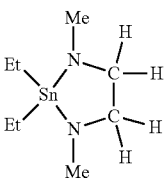
Compound No. 18
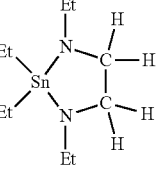
Compound No. 19
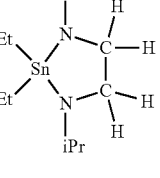
Compound No. 20
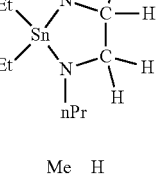
Compound No. 21
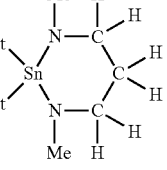

-continued
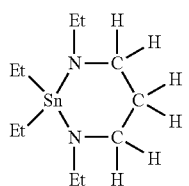
Compound No. 22
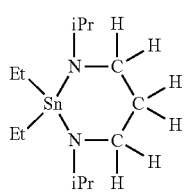
Compound No. 23
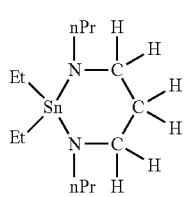
Compound No. 24
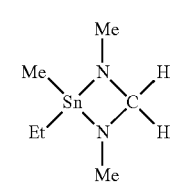
Compound No. 25
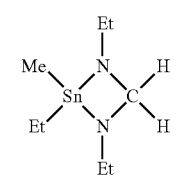
Compound No. 26
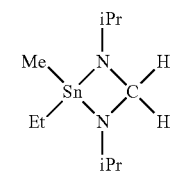
Compound No. 27
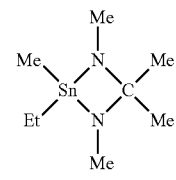
Compound No. 28
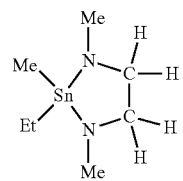
Compound No. 29
-continued
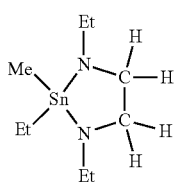
Compound No. 30
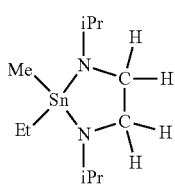
Compound No. 31
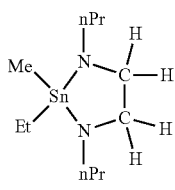
Compound No. 32
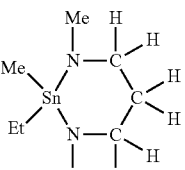
Compound No. 33
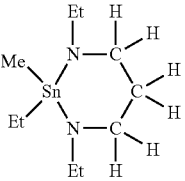
Compound No. 34
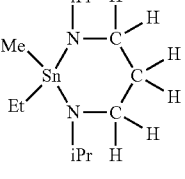
Compound No. 35
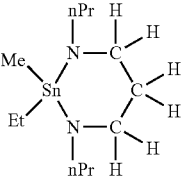
Compound No. 36
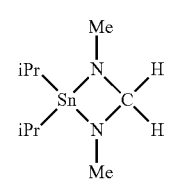
Compound No. 37

-continued
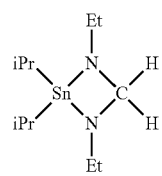
Compound No. 38
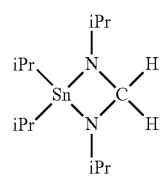
Compound No. 39
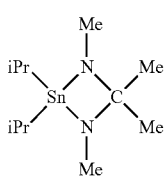
Compound No. 40
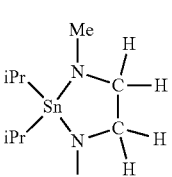
Compound No. 41
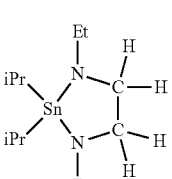
Compound No. 42
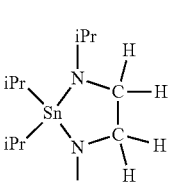
Compound No. 43
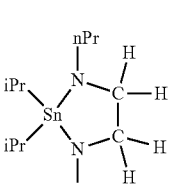
Compound No. 44
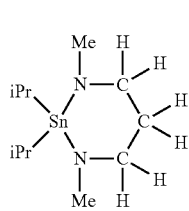
Compound No. 45
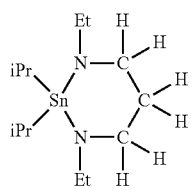
Compound No. 46
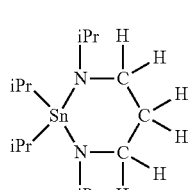
Compound No. 47
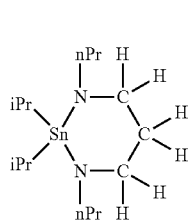
Compound No. 48
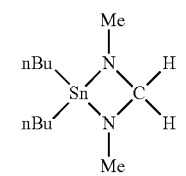
Compound No. 49
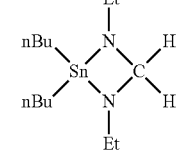
Compound No. 50
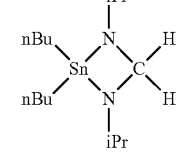
Compound No. 51
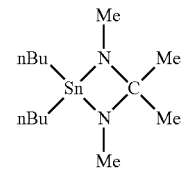
Compound No. 52
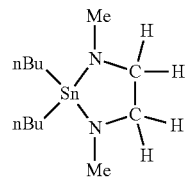
Compound No. 53

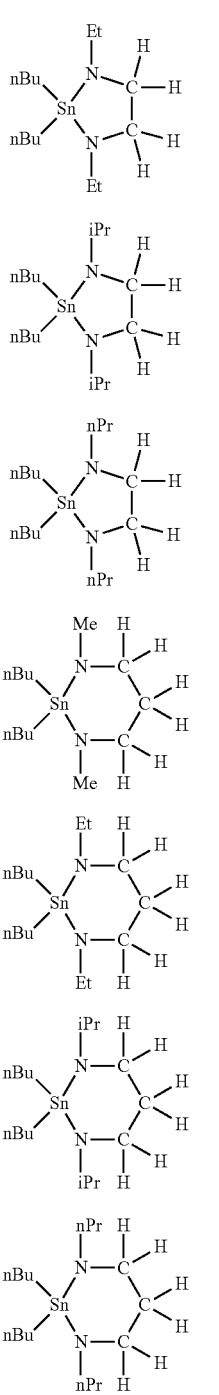

The tin compound of the present invention has a molecular weight of preferably from 200 to 500, more preferably from 230 to 300. When the molecular weight is less than 200, the thermal stability of the tin compound may be poor. When the molecular weight is more than 500, the melting point of the tin compound is excessively increased, and its utilization as a thin-film forming raw material may be difficult.

In a DSC chart obtained by increasing the temperature of the tin compound of the present invention under the condition of a temperature increase rate of 10° C./min from room temperature with a differential scanning calorimeter (DSC), the peak top temperature of an exothermic reaction is defined as a thermal decomposition starting temperature (° C.). In this case, a higher thermal decomposition starting temperature is preferred because the heat resistance of the tin compound becomes more excellent. The thermal decomposition starting temperature is preferably 180° C. or more, more preferably 200° C. or more.

In a DTA chart obtained by increasing the temperature of the tin compound of the present invention under the conditions of 760 Torr and a temperature increase rate of 10° C./min from room temperature with a thermogravimetric differential thermal analyzer (TG-DTA), a temperature at which the mass of the tin compound is reduced by 50 mass % is defined as a temperature (° C.) at normal pressure TG-DTA 50 mass % reduction. In this case, a lower temperature at normal pressure TG-DTA 50 mass % reduction is preferred because the tin compound can be vaporized at lower temperatures by virtue of having a high vapor pressure. The temperature at normal pressure TG-DTA 50 mass % reduction is preferably 200° C. or less, more preferably 180° C. or less.

In a DTA chart obtained by increasing the temperature of the tin compound of the present invention under the conditions of 10 Torr and a temperature increase rate of 10° C./min from room temperature with a TG-DTA, a temperature at which the mass of the tin compound is reduced by 50 mass % is defined as a temperature (° C.) at reduced pressure TG-DTA 50 mass % reduction. In this case, a lower temperature at reduced pressure TG-DTA 50 mass % reduction is preferred because the tin compound can be vaporized at lower temperatures by virtue of having a high vapor pressure. The temperature at reduced pressure TG-DTA 50 mass % reduction is preferably 180° C. or less, more preferably 150° C. or less.

Further, the tin compound of the present invention is preferably a liquid at normal temperature in order to ensure, in a film formation apparatus for producing a thin-film through use of the tin compound of the present invention, transportability in piping of the film formation apparatus. For example, Compounds No. 6 and No. 7 are preferred.

Of the tin compounds represented by the general formula (1), a compound in which $R^2$ and $R^3$ each represent a methyl group, and $R^1$ and $R^4$ each represent an isopropyl group is preferred because the compound is a liquid at normal temperature and has high thermal stability. Further, a compound in which $R^1$ represents a unit represented by the formula (x-6) (Compound No. 7) is more preferred. cl Thin-Film Forming Raw Material Next, a thin-film forming raw material of the present invention is described.

The thin-film forming raw material of the present invention only needs to contain the tin compound of the present invention and use the tin compound as a precursor of a thin-film, and the composition thereof varies depending on the kind of a target thin-film. For example, when a thin-film containing only tin as a metal is to be produced, the thin-film forming raw material of the present invention is free of a metal compound other than tin and a semimetal compound. Meanwhile, when a thin-film containing metal tin and a metal other than tin and/or a semimetal is to be produced, the thin-film forming raw material of the present invention may contain a compound containing a desired metal and/or a compound containing a semimetal (hereinafter referred to as "other precursor") in addition to the tin compound of the present invention. The thin-film forming raw material of the present invention may further contain an organic solvent and/or a nucleophilic reagent as described below.

In addition, in the case of a multi-component chemical vapor deposition method in which a plurality of precursors are used, there is no particular limitation on the other precursor to be used together with the tin compound of the present invention, and a well-known general precursor used for the thin-film forming raw material may be used.

Examples of the above-mentioned other precursor include compounds each containing: one or more kinds selected from the group consisting of compounds used as organic ligands, such as an alcohol compound, a glycol compound, a β-diketone compound, a cyclopentadiene compound, and an organic amine compound; and silicon or a metal. In addition, examples of the metal species in the precursor include lithium, sodium, potassium, magnesium, calcium, strontium, barium, titanium, zirconium, hafnium, vanadium, niobium, tantalum, chromium, molybdenum, tungsten, manganese, iron, osmium, ruthenium, cobalt, rhodium, iridium, nickel, palladium, platinum, copper, silver, gold, zinc, aluminum, gallium, indium, germanium, lead, antimony, bismuth, radium, scandium, yttrium, lanthanum, cerium, praseodymium, neodymium, promethium, samarium, europium, gadolinium, terbium, dysprosium, holmium, erbium, thulium, ytterbium, and lutetium.

Examples of the alcohol compound to be used as the organic ligand in the above-mentioned other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy) ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, and 2,4-dimethyl-2,4-pentanediol.

Examples of the 0-diketone compound to be used as the organic ligand in the above-mentioned other precursor include: alkyl-substituted 3-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted N-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

Examples of the cyclopentadiene compound to be used as the organic ligand in the above-mentioned other precursor include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene, and examples of the organic amine compound to be used as the above-mentioned organic ligand include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. One example of the production methods is given as described below. For example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal, and examples of the alkali metal alkoxide may include a sodium alkoxide, a lithium alkoxide, and a potassium alkoxide.

In the multi-component chemical vapor deposition method as described above, there are adopted: a method involving vaporizing and supplying each component of the thin-film forming raw material independently (hereinafter referred to as "single source method"); and a method involving vaporizing and supplying a mixed raw material obtained by mixing multi-component raw materials in accordance with desired composition in advance (hereinafter referred to as "cocktail source method").

In the case of the single source method, the above-mentioned other precursor is preferably a compound similar to the tin compound of the present invention in the behavior of thermal decomposition and/or oxidative decomposition.

In the case of the cocktail source method, the above-mentioned other precursor is preferably a compound that not only is similar to the tin compound of the present invention in the behavior of thermal decomposition and/or oxidative decomposition but also is prevented from being altered through a chemical reaction or the like at the time of mixing.

In the case of the cocktail source method, a mixture of the tin compound of the present invention and the other precursor, or a mixed solution obtained by dissolving the mixture in an organic solvent may be used as the thin-film forming raw material. The mixture or the mixed solution may further contain a nucleophilic reagent and the like.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl pentyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents may be used alone or as a mixture thereof depending on the solubility of a solute, the relationship among the use temperature, boiling point, and flash point of the solvent, and the like.

When the thin-film forming raw material of the present invention is the mixed solution with the organic solvent, the amount of the entire precursors in the thin-film forming raw material serving as a solution obtained by dissolving the precursors in the organic solvent is set to preferably from 0.01 mol/liter to 2.0 mol/liter, particularly preferably from 0.05 mol/liter to 1.0 mol/liter.

Wherein, when the thin-film forming raw material of the present invention is free of a metal compound other than the tin compound and a semimetal compound, the amount of the entire precursors refers to the total amount of the tin compound of the present invention and the other precursor containing tin. When the thin-film forming raw material of the present invention contains a compound containing another metal and/or a compound containing a semimetal (other precursor) in addition to the tin compound, the amount of the entire precursors refers to the total amount of the tin compound of the present invention and the other precursor.

In addition, the thin-film forming raw material of the present invention may contain a nucleophilic reagent as required in order to improve the stability of each of the tin compound of the present invention and the other precursor. Examples of the nucleophilic reagent include: ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N, N'-tetramethylethyleriediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidirne, N-methylmorpholine, tetrahydrofuran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. The usage amount of each of those nucleophilic reagents falls within the range of preferably from 0.1 mol to 10 mol, more preferably from 1 mol to 4 mol with respect to 1 mol of the amount of the entire precursors.

It is desired that the thin-film forming raw material of the present invention be prevented from containing impurity metal elements other than the components for forming the raw material, impurity halogens, such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, even more preferably 1 ppm or less. The total content of the impurity organic substances is preferably 500 ppm or less, more preferably 50 ppm or less, even more preferably 10 ppm or less. In addition, moisture causes generation of particles in the thin-film forming raw material and generation of particles during thin-film formation. Accordingly, in order to reduce moisture in each of the precursor, the organic solvent, and the nucleophilic reagent, the moisture is desirably removed as much as possible in advance at the time of use. The moisture content of each of the precursor, the organic solvent, and the nucleophilic reagent is preferably 10 ppm or less, more preferably 1 ppm or less.

In addition, it is preferred that the thin-film forming raw material of the present invention be prevented from containing particles to the extent possible in order to reduce or prevent particle contamination of a thin-film to be formed. Specifically, in particle measurement with a light scattering liquid particle detector in a liquid phase, it is preferred that the number of particles larger than 0.3 µm be 100 or less in 1 ml of the liquid phase, and it is more preferred that the number of particles larger than 0.2 µm be 100 or less in 1 ml of the liquid phase.

Method of Producing Thin-Film

Next, a method of producing a thin-film of the present invention by using the thin-film forming raw material is described.

Herein, as one embodiment, a method of producing a thin-film containing a tin atom (hereinafter referred to as "tin-containing thin-film") by an ALD method is described.

As an apparatus for producing a thin-film through use of the thin-film forming raw material of the present invention, a well-known ALD apparatus may be used. As specific examples of the apparatus, there are given an apparatus capable of performing bubbling supply of a precursor as illustrated in each of FIG. 1 and FIG. 3, and an apparatus comprising a vaporization chamber as illustrated in each of FIG. 2 and FIG. 4. In addition, there is given an apparatus capable of subjecting a reactive gas to plasma treatment as illustrated in each of FIG. 3 and FIG. 4. The apparatus is not limited to a single-wafer type apparatus comprising a film formation chamber (hereinafter referred to as "deposition reaction portion") as illustrated in each of FIG. 1 to FIG. 4, and an apparatus capable of simultaneously processing a plurality of wafers through use of a batch furnace may also be used. Those apparatus may also be each used as a CVD apparatus.

The method of producing a thin-film of the present invention is a method of producing a tin-containing thin-film on the surface of a substrate, the method being characterized by comprising: a first step comprising a "raw material gas introduction step" of introducing vapor (hereinafter referred to as "raw material gas") obtained by vaporizing the thin-film forming raw material of the present invention containing the tin compound represented by the general formula (1) into a deposition reaction portion (treatment atmosphere) and a "precursor layer formation step" of depositing the tin compound in the raw material gas on the surface of the substrate, to thereby form a precursor layer; an "exhaust step" of exhausting an unreacted raw material gas; a second step of introducing a reactive gas into the deposition reaction portion (treatment atmosphere) to cause the precursor layer and the reactive gas to react with each other; and an "exhaust step" of exhausting an unreacted reactive gas and a byproduct gas.

As one embodiment of the method of producing a thin-film in the present invention, description is given of a method of producing a tin-containing thin-film by repeating a cycle a plurality of times when deposition performed by a series of operations in which the first step, the exhaust step, the second step, and the exhaust step are performed in the stated order is defined as one cycle.

Now, each of the steps is described in detail.

First Step

Raw Material Gas Introduction Step

As a transportation and supply method for the thin-film forming raw material in the raw material gas introduction step, there are given a gas transportation method involving heating and/or decompressing the thin-film forming raw material of the present invention in a container in which the raw material is stored (hereinafter referred to as "raw material container"), to thereby vaporize the raw material to obtain a raw material gas as vapor, and introducing the raw material gas into a deposition reaction portion having a substrate set therein together with a carrier gas, such as argon, nitrogen, or helium, as required as illustrated in each of FIG. 1 and FIG. 3, and a liquid transportation method involving transporting the thin-film forming raw material under the state of a liquid or a solution to a vaporization chamber, heating and/or decompressing the raw material in the vaporization chamber, to thereby vaporize the raw material to obtain a raw material gas as vapor, and introducing the raw material gas to the deposition reaction portion as illustrated in each of FIG. 2 and FIG. 4.

In the case of the gas transportation method, the tin compound represented by the general formula (1) itself may be used as the thin-film forming raw material.

In the case of the liquid transportation method, the tin compound represented by the general formula (1) or a solution obtained by dissolving the compound in an organic solvent may be used as the thin-film forming raw material. Those thin-film forming raw materials may each further contain the other precursor, a nucleophilic reagent, or the like.

In addition, as other methods to be used in the raw material gas introduction step than the gas transportation method and the liquid transportation method, there are given the single source method and the cocktail source method, which have been described in the "Thin-film Forming Raw material" section as multi-component ALD methods. Regardless of which introduction method is used, the thin-film forming raw material of the present invention is preferably vaporized at a temperature of from 0° C. to 200° C. In addition, when the thin-film forming raw material is vaporized to obtain vapor in the raw material container or in the vaporization chamber, the pressure in the raw material container and the pressure in the vaporization chamber preferably fall within the range of from 1 Pa to 10,000 Pa.

Herein, as a material for the substrate to be set in the deposition reaction portion, there are given, for example: silicon; ceramics, such as silicon nitride, titanium nitride, tantalum nitride, titanium oxide, titanium nitride, ruthenium oxide, zirconium oxide, hafnium oxide, and lanthanum oxide; glass; and metals, such as metal cobalt and metal ruthenium. The shape of the substrate is, for example, a plate shape, a spherical shape, a fibrous shape, or a scaly shape. The surface of the substrate may be planar, or may have a three-dimensional structure, such as a trench structure.

Precursor Layer Formation Step

In the precursor layer formation step, the tin compound in the raw material gas introduced into the deposition reaction portion having the substrate set therein is deposited on the surface of the substrate, to thereby form the precursor layer on the surface of the substrate. At this time, heat may be applied by heating the substrate or heating the deposition reaction portion. There are no particular limitations on the conditions under which the precursor layer is formed, but for example, a reaction temperature (substrate temperature), a reaction pressure, a deposition rate, and the like may appropriately be determined depending on a desired thickness of the precursor layer and the kind of the thin-film forming raw material. The reaction temperature is preferably not less than 50° C. that is the temperature at which the thin-film forming raw material of the present invention sufficiently reacts with the surface of the substrate, more preferably from 50° C. to 400° C. A film thickness is controlled by the number of cycles so that a desired film thickness is obtained. The reaction pressure is preferably from 1 Pa to 10,000 Pa, more preferably from 10 Pa to 1,000 Pa.

When the thin-film forming raw material contains the other precursor than the tin compound of the present invention, the other precursor is also deposited on the surface of the substrate together with the tin compound.

Exhaust Step

After the precursor layer has been formed, an unreacted raw material gas containing the tin compound not having been deposited on the surface of the substrate is exhausted from the deposition reaction portion. At this time, it is ideal that the raw material gas be completely exhausted from the deposition reaction portion, but it is not always required that the gas be completely exhausted. As an exhaust method, there are given, for example, a method involving purging the inside of the system of the deposition reaction portion with an inert gas, such as helium, nitrogen, or argon, an exhaust method involving performing exhaust by decompressing the inside of the system, and a combination of these methods. The degree of decompression in the case of performing decompression falls within the range of preferably from 0.01 Pa to 300 Pa, more preferably from 0.01 Pa to 100 Pa.

Second Step

In the second step, the reactive gas is introduced into the deposition reaction portion after the exhaust step so that the reactive gas is caused to react with the precursor layer, that is, the tin compound having been deposited on the surface of the substrate through the action of the reactive gas or through the action of the reactive gas and the action of heat. Examples of the reactive gas include: oxidizing gases, such as oxygen, ozone, nitrogen dioxide, nitrogen monoxide, water vapor, hydrogen peroxide, formic acid, acetic acid, and acetic anhydride; reducing gases, such as hydrogen; organic amine compounds, such as a monoalkylamine, a dialkylamine, a trialkylamine, and an alkylenediamine; and nitriding gases, such as hydrazine and ammonia. Those reactive gases may be used alone or as a mixture thereof. The thin-film forming raw material of the present invention has the property of reacting with the oxidizing gases out of those gases at specifically low temperatures, and particularly, can react with ozone and water vapor at low temperatures. A gas containing ozone or water vapor is preferably used as the reactive gas, and a gas containing water vapor is more preferably used as the reactive gas because a film thickness obtained per cycle is large, and a thin-film can be produced with good productivity.

When the reactive gas is the oxidizing gas, and only the tin compound of the present invention is used as the precursor in the first step, a tin atom on the surface of the substrate is oxidized to form a tin oxide thin-film. At this time, a component other than the tin atom in the precursor layer turns into a by-product gas.

There are no particular limitations on the reaction conditions, but for example, a reaction temperature (substrate temperature), a reaction pressure, a deposition rate, and the like may appropriately be determined depending on a desired film thickness and the kind of the reactive gas. The temperature when the heat is applied preferably falls within the range of from room temperature to 500° C., more preferably from 50° C. to 400° C. An ALD window in the case of using the thin-film forming raw material of the present invention and the reactive gas in combination falls within the range of from about 50° C. to about 200° C., and hence the precursor layer and the reactive gas are more preferably caused to react with each other at a temperature within the range of from 50° C. to 200° C. The pressure in the deposition reaction portion when this step is performed is preferably from 1 Pa to 10,000 Pa, more preferably from 10 Pa to 1,000 Pa.

The thin-film forming raw material of the present invention has satisfactory reactivity with the reactive gas, and hence when the thin-film forming raw material of the present invention is used, a high-quality tin-containing thin-film containing less residual carbon can be produced with good productivity.

Exhaust Step

After the second step, the unreacted reactive gas and the by-product gas are exhausted from the deposition reaction portion. At this time, it is ideal that the reactive gas and the by-product gas be completely exhausted from the deposition reaction portion, but it is not always required that the gases be completely exhausted. An exhaust method and the degree of decompression in the case of performing decompression are the same as those in the above-mentioned exhaust step performed between the first step and the second step.

When the ALD method is adopted as described above in the method of producing a thin-film of the present invention, thin-film deposition performed by a series of operations in which the first step, the exhaust step, the second step, and the exhaust step are performed in the stated order is defined as one cycle. The cycle is repeated a plurality of times until a thin-film having a required film thickness is obtained. Thus, a tin-containing thin-film having a desired film thickness can be produced. According to the method of producing a thin-film by the ALD method, the film thickness of the tin-containing thin-film to be formed can be controlled by the number of the cycles.

When the film thickness of the tin-containing thin-film obtained per cycle is large, the characteristics of the thin-film may deteriorate. When the film thickness of the tin-containing thin-film obtained per cycle is small, a problem occurs in productivity. Accordingly, the film thickness of the tin-containing thin-film obtained per cycle is preferably from 0.001 nm to 1 nm, more preferably from 0.01 nm to 0.5 nm.

In addition, in the method of producing a thin-film of the present invention, as illustrated in each of FIG. 3 and FIG. 4, energy, such as plasma, light, or a voltage, may be applied to the deposition reaction portion, or a catalyst may be used. There are no particular limitations on the timing for applying the energy and the timing for using the catalyst. The energy may be applied or the catalyst may be used, for example, at the time of introducing the raw material gas of the thin-film forming raw material into the deposition reaction portion in the raw material gas introduction step, at the time of heating in the precursor layer formation step, at the time of introducing the reactive gas, or at the time of heating when the reactive gas and the precursor layer are caused to react with each other, in the second step, at the time of exhausting the inside of the system in the exhaust step, or between the above-mentioned respective steps.

In addition, in the method of producing a thin-film of the present invention, the reactive gas may be continuously introduced into the deposition reaction portion through all the steps in the production method, or a gas obtained by subjecting the reactive gas to plasma treatment may be introduced into the deposition reaction portion only in the step of causing the precursor layer and the reactive gas to react with each other. When the output of a radiofrequency wave (hereinafter sometimes referred to as "RF") at the time of the plasma treatment is excessively low, a satisfactory tin-containing thin-film is hardly obtained, and when the output is excessively high, damage to the substrate is increased. Accordingly, the output of the radiofrequency wave is preferably from 0 W to 1,500 W, more preferably from 50 W to 600 W.

In addition, in the method of producing a thin-film of the present invention, after the formation of the tin-containing thin-film, annealing treatment may be performed under an inert atmosphere, an oxidizing atmosphere, or a reducing atmosphere in order to obtain more satisfactory electrical characteristics. When step embedding is required, a reflow step may be provided. The temperature of the atmosphere in this case is preferably from 200° C. to 1,000° C., more preferably from 250° C. to 500° C.

The tin-containing thin-film to be produced by using the thin-film forming raw material of the present invention may be formed as a desired kind of thin-film, which covers a substrate formed of, for example, a metal, an oxide ceramic, a nitride ceramic, or glass, by appropriately selecting the other precursor, the reactive gas, and the production conditions. The tin-containing thin-film of the present invention is excellent in electrical characteristics and optical characteristics, and hence can be widely used in the production of, for example, electrode materials for memory elements typified by DRAM elements, resistance films, diamagnetic films used for the recording layers of hard disks, and catalyst materials for polymer electrolyte fuel cells.

While the method of producing a tin-containing thin-film by the ALD method has been described in this embodiment, the method of producing a thin-film through use of the thin-film forming raw material of the present invention is not limited to the above-mentioned method, and only needs to be a method comprising introducing a raw material gas obtained by vaporizing the thin-film forming raw material into a deposition reaction portion having a substrate set therein, and subjecting the tin compound in the raw material gas to decomposition and/or a chemical reaction in the deposition reaction portion, to thereby produce a tin-containing thin-film on the surface of the substrate.

For example, the tin-containing thin-film may be produced by a CVD method through use of the thin-film forming raw material containing the tin compound of the present invention. In this case, the raw material gas and the reactive gas are introduced into the deposition reaction portion having the substrate set therein, and the tin compound in the raw material gas and the reactive gas are caused to react with each other in the deposition reaction portion. Thus, the tin-containing thin-film is produced on the surface of the substrate.

Further, the tin compound of the present invention may be used as a thin-film forming raw material for, for example, a sputtering method, an ion plating method, and MOD methods, such as a coating thermal decomposition method and a sol-gel method, in addition to the above-mentioned ALD method and CVD method. Of those, the ALD method is preferred because the method has many advantages, such as excellent composition controllability and step coverage, suitability for mass production, and capability of hybrid integration.

EXAMPLES

The present invention is described in more detail below by way of Production Examples, Examples, and the like. However, the present invention is by no means limited by Examples and the like below.

[Production Example 1] Synthesis of Compound No. 5

1.9 g (0.009 mol) of dimethyltin dichloride and 12.6 g of diethyl ether were loaded into a 100-milliliter three-necked flask and stirred at room temperature. After the stirring, the mixture was cooled with ice, and a solution prepared in advance by mixing 0.8 g (0.009 mol) of N,N'-dimethylethylenediamine, 12.9 g of diethyl ether, and 7.6 g of a n-butyllithium/hexane solution (0.009 mol of n-butyllithium) was added dropwise thereto under cooling with ice. After the dropwise addition, the temperature of the mixture was increased to room temperature, and the mixture was stirred for 18 hours. After the stirring, impurities were separated from the mixture through filtration, and the residue obtained by removing the solvent from the resultant filtrate was distilled under the conditions of a heating temperature of 115° C. and a pressure of 87 Pa with a Kugelrohr purification apparatus. Thus, a white gel solid was obtained. The resultant white solid was analyzed by $^1$H-NMR and ICP-AES, and as a result, was identified as Compound No. 5, which was a target compound. The analysis results of the resultant white solid by $^1$H-NMR and ICP-AES are shown below.

Analysis Results by $^1$H-NMR (Deuterated Benzene)

0.11 ppm (61H, s), 2.54 ppm (6H, s), 2.83 ppm (4H, bs)

Analysis Results by iCP-AES

Content of tin: 49.8 mass % (theoretical value: 50.53 mass %)

Production Example 2 Synthesis of Compound No. 6

11.5 g (0.052 mol) of dimethyltin dichloride and 32.0 g of diethyl ether were loaded into a 300-milliliter four-necked flask and stirred at room temperature. After the stirring, the mixture was cooled with ice, and a solution prepared by mixing 6.5 g (0.056 mol) of N,N'-diethylethylenediamine, 30.5 g of diethyl ether, and 47.1 g of a n-butyllithium/hexane solution (0.110 mol of n-butyllithium) was added dropwise thereto under cooling with ice. After the dropwise addition, the temperature of the mixture was increased to room temperature, and the mixture was stirred for 17 hours. After the stirring, the solvent was removed from a filtrate obtained by separating impurities from the mixture through filtration, and the residue was distilled at a bath temperature of 90° C. under slightly reduced pressure. Thus, 3.6 g of a colorless liquid was obtained. The resultant colorless liquid was analyzed by +H-NMR and ICP-AES, and as a result, was identified as Compound No. 6, which was a target compound. The analysis results of the resultant colorless liquid by $^1$H-NMR and ICP-AES are shown below.

Analysis Results by $^1$H-NMR (Deuterated Benzene)

21 ppm (6H, s), 1.04 ppm to 1.08 ppm (6H, t), 2.97 ppm (4H, m), 3.04 ppm (4H, bs)

Analysis Results by ICP-AES

Content of tin: 45.2 mass % (theoretical value: 45.14 mass %)

Production Example 3 Synthesis of Compound No. 7

12.5 g (0.057 mol) of dimethyltin dichloride and 49.8 g of diethyl ether were loaded into a 300-milliliter four-necked flask and stirred at room temperature. After the stirring, the mixture was cooled with ice, and a solution prepared by mixing 8.9 g (0.062 mol) of N,N-diisopropylethylenediamine, 42.2 g of diethyl ether, and 51.3 g of a n-butyllithium/hexane solution (0.119 mol of n-butyllithium) was added dropwise thereto under cooling with ice. After the dropwise addition, the temperature of the mixture was increased to room temperature, and the mixture was stirred for 20 hours, followed by separation of impurities therefrom through filtration. The solvent was removed from the resultant filtrate, and the residue was distilled at a bath temperature of 100° C. under slightly reduced pressure. Thus, 11.7 g of a colorless liquid was obtained. The resultant colorless liquid was analyzed by $^1$H-NMR and ICP-AES, and as a result, was identified as Compound No. 7, which was a target compound. The analysis results of the resultant colorless liquid by $^1$H-NMR and ICP-AES are shown below.

Analysis Results by H-NMR (Deuterated Benzene)

31 ppm (6H, s), 1.05 ppm to 1.07 ppm (12H, d), 3.13 ppm (4H, s), 3.16 ppm to 3.22 ppm (2H, m)

Analysis Results by ICP-AES

Content of tin: 40.9 mass % (theoretical value: 40.79 mass %)

Evaluation Examples

The following evaluations were performed by using the compounds of Examples 1 to 3 obtained in Production Examples 1 to 3 described above. The results are shown in Table 1.

(1) Evaluation of State and Melting Point

The state of each of the compounds at normal pressure and 25° C. was visually observed, and when the compound was a solid, its melting point was measured with a micro melting point meter. The results are shown in Table 1.

(2) Thermal Decomposition Starting Temperature (° C.)

In a DSC chart obtained through measurement performed with a differential scanning calorimeter DSC at a temperature increase rate of 10° C./min in a scanning temperature range of from 70° C. to 500° C., the peak top temperature of an exothermic reaction was defined as a "thermal decomposition starting temperature (° C.)." The results are shown in Table 1.

(3) Temperature (° C.) at Normal Pressure TG-DTA 50 Mass % Reduction

Measurement was performed with a TG-DTA at 760 Torr, an Ar flow rate of 100 mL/min, and a temperature increase rate of 10° C./min in a scanning temperature range of from 30° C. to 600° C. A temperature (° C.) at which the weight of a test compound was reduced by 50 mass % was evaluated as a "temperature (° C.) at normal pressure TG-DTA 50 mass % reduction." A lower temperature (° C.) at normal pressure TG-DTA 50 mass % reduction indicates that vapor is obtained at lower temperatures. The results are shown in Table 1.

(4) Temperature (° C.) at Reduced Pressure TG-DTA 50 Mass % Reduction

Measurement was performed with a TG-DTA at 10 Torr, an Ar flow rate of 50 mL/min, and a temperature increase rate of 10° C./min in a scanning temperature range of from 30° C. to 600° C. A temperature (° C.) at which the weight of a test compound was reduced by 50 mass % was evaluated as a "temperature (° C.) at reduced pressure TG-DTA 50 mass % reduction." A lower temperature (C) at reduced pressure TG-DTA 50 mass % reduction indicates that vapor is obtained at lower temperatures. The results are shown in Table 1.

obtained per cycle was 0.049 nm. The ALD window of Compound No. 7 was identified to be from 50° C. to 200° C.

ALD Apparatus Conditions

Substrate: silicon wafer

Reaction temperature (silicon wafer temperature): 75° C.

Reactive gas: water vapor

Step

A series of steps comprising the following (1) to (4) was defined as one cycle, and this cycle was repeated 350 times.

(1) A precursor layer is formed by introducing vapor (raw material gas) of the thin-film forming raw material obtained through vaporization under the conditions of a raw material container temperature of 50° C. and a raw material container internal pressure of 100 Pa into a deposition reaction portion, and depositing the tin compound on the surface of a silicon wafer at a system pressure of 100 Pa for 60 seconds.

(2) A raw material gas containing the tin compound not having been deposited on the surface of the substrate is exhausted from the deposition reaction portion through argon purging for 15 seconds.

(3) A reactive gas is introduced into the deposition reaction portion, and the precursor layer and the reactive gas are caused to react with each other at a system pressure of 100 Pa for 60 seconds.

(4) An unreacted reactive gas and a by-product gas are exhausted from the deposition reaction portion through argon purging for 15 seconds.

TABLE 1

|  | Compound | State (@25° C.) | Melting point (° C.) | Thermal decomposition starting temperature (° C.) | Temperature (° C.) at normal pressure TG-DTA 50 mass % reduction | Temperature (° C.) at reduced pressure TG-DTA 50 mass % reduction |
|---|---|---|---|---|---|---|
| Example 1 | No. 5 | Solid | 38 | Unmeasured | 178 | 114 |
| Example 2 | No. 6 | Liquid | — | 204 | 133 | 69 |
| Example 3 | No. 7 | Liquid | — | 265 | 144 | 72 |

Example 4 Production of Tin-containing Thin-film by ALD Method

A tin-containing thin-film was produced on a silicon wafer under the following conditions with an ALD apparatus of FIG. 1 by using Compound No. 7 (Example 3) as a thin-film forming raw material. When the composition of the obtained thin-film was identified by X-ray photoelectron spectroscopy, the obtained thin-film was tin oxide, and no residual carbon was detected. In addition, when its film thickness was measured by scanning electron microscopy, and the average value thereof was calculated, the film thickness was 17.2 nm, and the average film thickness Comparative Example 1

A tin oxide thin-film was produced under the same conditions as those in Example 4 except that the following Comparative Compound No. 1 was used as a thin-film forming raw material. When the composition of the obtained thin-film was identified by X-ray photoelectron spectroscopy, the obtained thin-film was tin oxide and contained 10 atom % or more of residual carbon. When its film thickness was measured by scanning electron microscopy, and the average value thereof was calculated, the film thickness was 14.0 nm, and the average film thickness obtained per cycle was 0.04 nm. The ALD window of Comparative Compound No. 1 was identified to be from 50° C. to 150° C.

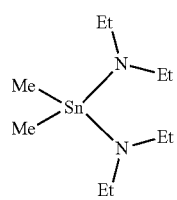

Comparative Compound No. 1

It was able to be recognized from Examples 2 and 3 that the tin compound of the present invention had a thermal decomposition starting temperature of 200° C. or more and was excellent in thermal stability. In addition, it was able to be recognized from Examples 1 to 3 that the tin compound of the present invention had a temperature at normal pressure TG-DTA 50 mass % reduction of 200° C. or less and a temperature at reduced pressure TG-DTA 50 mass % reduction of 180° C. or less, and hence showed a high vapor pressure and was vaporized at lower temperatures.

In addition, it was able to be recognized from Comparative Example 1 that, when a thin-film was produced by an ALD method through use of a tin compound other than the tin compound of the present invention as a thin-film forming raw material, a carbon component remained in a large amount in the obtained thin-film. In contrast, it was able to be recognized from Example 4 that no residual carbon was detected in the thin-film produced through use of the thin-film forming raw material containing the tin compound of the present invention, and a high-quality tin-containing thin-film was able to be produced. In addition, it was able to be recognized that the thin-film forming raw material of the present invention had a wider ALD window than that of the thin-film forming raw material containing Comparative Compound No. 1.

It was recognized from the foregoing that the tin compound of the present invention showed excellent thermal stability and a high vapor pressure, and when a thin-film was produced by using the thin-film forming raw material of the present invention, the thin compound has a wide ALD window, and a high-quality tin-containing thin-film was able to be produced.

The invention claimed is:

1. A tin compound represented by the following general formula (1):

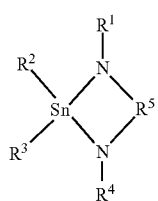

(1)

wherein $R^1$ and $R^4$ each independently represent an ethyl group or an isopropyl group, $R^2$ and $R^3$ each independently represent an alkyl group having 1 to 5 carbon atoms, and $R^5$ represents an alkanediyl group represented by the following formula (x-6)

(x-6)

wherein each * represents a linking position to a nitrogen atom in the general formula (1), and
having a molecular weight of 230 to 300.

2. A thin-film forming raw material, containing the tin compound of claim 1.

3. A method of using the tin compound of claim 1 as a precursor for producing a thin-film containing a tin atom by a chemical vapor deposition method, the method comprising:
vaporizing the tin compound to obtain a raw material gas,
introducing the raw material gas into a treatment atmosphere having a substrate set therein, and depositing the tin compound in the raw material gas on a surface of the substrate to form a precursor layer, and
introducing a reactive gas into the treatment atmosphere and causing the tin compound in the precursor layer and the reactive gas to react, to thereby produce the thin-film containing a tin atom on the surface of the substrate.

4. A method of producing a thin-film, comprising:
introducing a raw material gas obtained by vaporizing the thin-film forming raw material of claim 2 into a treatment atmosphere having a substrate set therein; and
subjecting the tin compound in the raw material gas to decomposition and/or a chemical reaction in the treatment atmosphere, to thereby produce a thin-film containing a tin atom on a surface of the substrate.

5. A method of producing a thin-film containing a tin atom on a surface of a substrate by an atomic layer deposition method, the method comprising:
a first step of introducing a raw material gas obtained by vaporizing the thin-film forming raw material of claim 2 into a treatment atmosphere, and depositing the tin compound in the raw material gas on the surface of the substrate, to thereby form a precursor layer; and
a second step of introducing a reactive gas into the treatment atmosphere to cause the precursor layer and the reactive gas to react with each other.

6. The method of producing a thin-film according to claim 5, further comprising a step of exhausting a gas in the treatment atmosphere at least one of between the first step and the second step or after the second step.

* * * * *